(12) United States Patent
Blanchard et al.

(10) Patent No.: US 6,819,195 B1
(45) Date of Patent: Nov. 16, 2004

(54) STIMULATED QUICK START OSCILLATOR

(75) Inventors: Shane A. Blanchard, Chubbuck, ID (US); Jeremy J. Rice, Pocatello, ID (US)

(73) Assignee: AMI Semiconductor, Inc., Pocatello, ID (US)

( * ) Notice: Subject to any disclaimer, the term of this patent is extended or adjusted under 35 U.S.C. 154(b) by 110 days.

(21) Appl. No.: 10/384,094

(22) Filed: Mar. 7, 2003

(51) Int. Cl.[7] .............................................. H03B 5/06
(52) U.S. Cl. ...................................... 331/173; 331/158
(58) Field of Search ........................ 331/55, 57, 116 R, 331/116 FE, 116 M, 154, 158, 165, 166, 173

(56) References Cited

U.S. PATENT DOCUMENTS

| | | | |
|---|---|---|---|
| 4,039,973 A | 8/1977 | Yamashiro | 331/116 |
| 4,196,404 A * | 4/1980 | Ebihara | 331/116 FE |
| 5,844,448 A | 12/1998 | Jackoski et al. | 331/158 |
| 6,191,662 B1 | 2/2001 | Volk | 331/158 |

* cited by examiner

Primary Examiner—David Mis
(74) Attorney, Agent, or Firm—Workman Nydegger

(57) ABSTRACT

An oscillation circuit including a resonating element such as a crystal, an inverting amplifier and a resistor that each span the resonating element terminals, and two capacitors that capacitively couple the resonating element terminals to ground. An AC current source such as a temperature compensated and properly trimmed ring oscillator generates a differential AC current when active. The differential AC current has a frequency that is within a tolerance of the resonant frequency of the resonant element for a given set of operating conditions. Two buffers connect the differential outputs of the AC current source to respective terminals of the resonating element to thereby shorten startup time. A control logic circuit carefully times the application of the differential AC current to the resonating element terminals such that the current is applied for a sufficient time such that startup would occur under any anticipated operating condition.

21 Claims, 3 Drawing Sheets

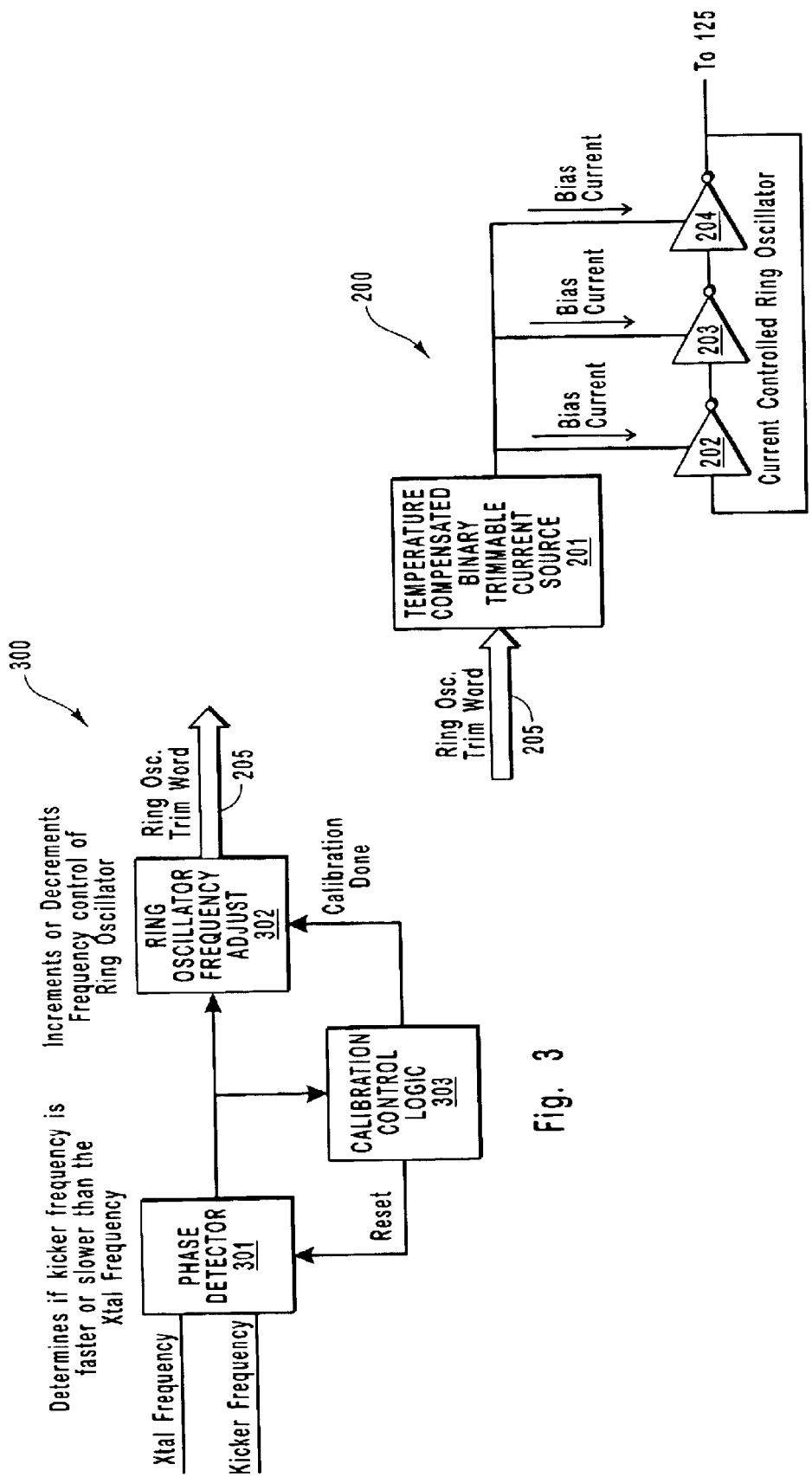

STIMULATED QUICK START OSCILLATOR

BACKGROUND OF THE INVENTION

1. The Field of the Invention

The invention relates generally to oscillators, and more specifically, to an oscillator that has a rapid and predictable startup time by stimulating the oscillator terminals with a controlled Alternating Current (AC) voltage source.

2. Background and Related Art

Wireless communication has revolutionized our way of life by allowing devices and their associated users to communicate without the device having to be connected to a fixed communication interface. Instead, wireless devices are capable of communicating over wireless networks even while mobile. As such devices are mobile, they often are not connected to a fixed power source, and must instead rely on battery power. In order to reduce the user's burden in having to recharge or replace the battery, it is often advantageous for such devices to preserve battery power by having a low power mode in which all but the most critical circuits run on low power or are turned off entirely when the user is not actively using the device. The device then at least partially powers up again once the need arises.

The time that it takes for a device to transition from the lower power mode ito the increased power mode needed for proper operation is often referred to as the "startup time" of the device. A slower startup time can significantly degrade the performance of the device depending on the application. In some cases, the device should start up in a matter of microseconds in order to achieve acceptable performance. In many devices, the limiting circuit element that tends to provide a lower limit on startup time is the crystal oscillator. The crystal oscillator is a component of many circuits that rely on a signal having a given and known frequency. While wireless communication devices have been previously mentioned, the crystal oscillator may be used for purposes that are not communication-oriented such as for providing a clock signal of a given and known frequency. The startup time of the crystal oscillator is also unpredictable and can vary even within the same device. In many conventional circuits, the crystal oscillator is allowed time to start up by amplifying its own internally generated noise and repeatedly amplifying the resulting signal using a feedback loop.

FIG. 4 illustrates a conventional crystal oscillator circuit 400 in accordance with the prior art. The circuit 400 includes a resonating element 401 that provides the noise for amplification. The resonating element 401 may be any circuit capable of resonating at a particular frequency or a range of frequencies. Accordingly, the resonating element 401 may be a ceramic resonator, any inductor-capacitor equivalent circuit, but most typically is a crystal. The crystal is conventionally used due to its reliability in providing a relatively stable resonating frequency over long periods of time.

One terminal of the resonating element 401 is provided as input to an inverting aO amplifier 402, which outputs the amplified signal to the other terminal of the resonating element 401. Capacitor 404 (also identified as element $C_1$) has one terminal connected to a terminal of the resonating element 401 and the other terminal connected to ground.

Likewise, capacitor 405 (also identified as element $C_2$) has one terminal connected to the other terminal of the resonating element 401 and the other terminal connected to ground. The capacitors thus configured allow the terminals of the resonating element 401 to support an Alternating Current (AC) signal. Resistor 403 (also identified as element RF) is used to bias up the amplifier and complete the Direct Current (DC) feedback loop while providing some AC gain isolation.

As time proceeds forward, the differential AC voltage applied at the terminals of the resonating element 401 will become of sufficient magnitude to be useful. In the case of FIG. 4, the differential AC voltage may be applied as input to the buffer 406, which uses the differential AC voltage to generate a clock signal of the same primary frequency. In that case, the startup time is the time required for the crystal oscillator to amplify the internally generated noise to a differential AC voltage of sufficient magnitude that the buffer 406 may generate a useful clock signal.

This conventional crystal oscillator circuit 400 is useful for many applications that do not require rapid startup times. Typical startup times for such a crystal oscillator circuit can be as high as from one to ten milliseconds. Furthermore, the circuit requires relatively few devices and thus is relatively inexpensive to manufacture. However, sometimes, such long startup times may be unacceptable. Accordingly, there have been conventional attempts to reduce the startup time of a crystal oscillator circuit.

One conventional technique is to initially increase the gain of the amplifier when startup first initiates and the noise voltage levels are smaller. As the differential AC voltage applied at the resonator element increases, the gain of the amplifier is reduced. This conventional technique reduces startup time somewhat, while still relying completely on the internally generated noise as the initial source of resonance. Since the initial level of noise is quite random, the time that it takes for the amplified signal to reach useful levels can vary significantly.

A second conventional approach is to make the capacitors $C_1$ and $C_2$ of FIG. 4 as small as possible for use during startup. Since there is less capacitive load to charge during startup, startup occurs more quickly. After startup, additional capacitive load is connected to the resonating element 401. This conventional method also reduces startup time, but to unpredictable levels since this technique also relies solely on internally generated noise as the initial signal to be amplified.

A third conventional approach is to initiate startup by applying a single pulse across the crystal to start oscillations. This ensures that the crystal will move off its stable state and start oscillating thereby reducing startup time, and provides some improvement in predictability of the startup time.

Nevertheless, some applications are sensitive to variations in startup time. Accordingly, what would be advantageous are crystal oscillator circuits and methods of operating the same in which the startup time is reduced and more predictable. One additional disadvantage of the above-mentioned methods is that they do not compensate for process and temperature variations that are inevitable and that can significantly vary the startup time. Accordingly, what would be further advantageous is if the crystal oscillator circuit provided a quick and predictable startup time that is less dependent on process and temperature variations.

BRIEF SUMMARY OF THE INVENTION

The foregoing problems with the prior state of the art are overcome by the principles of the present invention, which are directed towards an oscillation circuit that is capable of starting up quickly and that has a predictable startup time. The principles of the present invention are also related to methods for starting up the oscillation circuit.

Like conventional oscillation circuits, the oscillation circuit in accordance with the principles of the present invention includes a resonating element that has internally generated noise and that has a resonant frequency. For example, the resonating element may be a crystal, a ceramic or any inductor/capacitor equivalent circuit.

Also like conventional oscillating circuits, the circuit includes an inverting amplifier receiving one terminal of the resonating element as input and having an output terminal connected to the other terminal of the resonating element. A resistor is coupled between the terminals of the resonating element. One capacitor capacitively couples one terminal of the resonating element to a substantially fixed voltage source such as ground, while another capacitor capacitively couples the other terminal of the resonating element to a substantially fixed voltage source such as ground.

Unlike conventional oscillator circuits, an AC current source is configured to generate a differential AC current applied between the two output terminals when active. The differential AC current has a frequency that is within a tolerance of the resonant frequency of the resonant element for a given set of operating conditions. Two buffers connect the differential outputs of the AC current source to respective terminals of the resonating element to thereby shorten startup time. The AC current source may be a temperature compensated ring oscillator to thereby more closely match its frequency to the resonant frequency of the resonating element. A calibration circuit may provide the temperature compensating ring oscillator with calibration to compensate for process variations. This process and temperature compensation allows for an AC differential current having a frequency that is very close to the resonant frequency of the resonating element for various different operating temperatures and process variations. Accordingly, startup time is reduced.

In order to improve the predictability in the startup time, control logic times the activation and deactivation of the AC current source and the buffers so that the differential AC current source is applied to the terminals of the resonating element for sufficient time such that startup would occur even under the worst of a given set of operating conditions or process variations. At the end of that designated time, the AC differential current is disconnected from the terminals of the resonating element thereby allowing the resonating element to generate the reliable AC signal also having the resonating frequency. Accordingly, the predictability of startup times is improved.

Additional features and advantages of the invention will be set forth in the description that follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which:

FIG. 2 illustrates a schematic diagram of a temperature controlled ring oscillator that may be used as the oscillator of FIG. 1;

FIG. 3 illustrates a schematic diagram of a calibration circuit that may be used as the calibration circuit in FIG. 1.

DETAILED DESCRIPTION OF THE PREFERRED EMBODIMENTS

The principles of the present invention are directed towards an oscillation circuit that is capable of starting up quickly and that has a predictable startup time. The oscillation circuit includes the conventional resonating circuit that includes the resonating element (e.g., the crystal), an inverting amplifier and a resistor that each span the resonating element terminals, and two capacitors that capacitively coupled the resonating element terminals to a fixed voltage source such as ground.

Unlike conventional oscillator circuits, an AC current source is configured to generate a differential AC current applied between the two output terminals when active. The differential AC current has a frequency that is within a tolerance of the resonant frequency of the resonating element for a given set of operating conditions. Two buffers connect the differential outputs of the AC current source to respective terminals of the resonating element to thereby shorten startup time by actively stimulating the respective terminals of the resonating element. The AC current source may be a temperature compensated ring oscillator to thereby more closely match its frequency to the resonant frequency of the resonating element. A control logic circuit carefully times the application of the differential AC current to the resonating element terminals such that the current is applied for a sufficient time such that startup would occur even under the worst of a given set of operating conditions or process variations.

Figure 1:
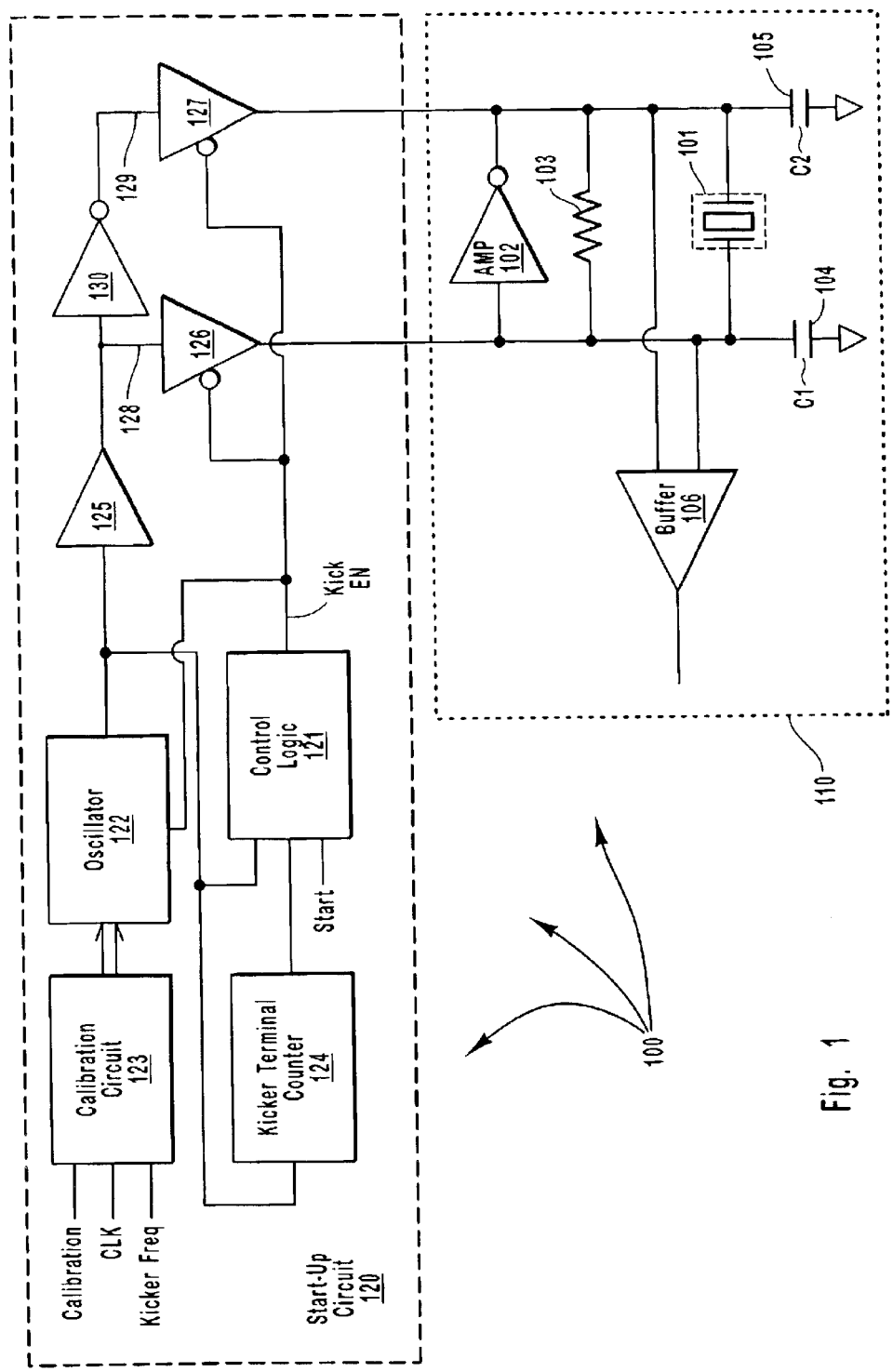
FIG. 1 illustrates a schematic diagram of an oscillator circuit in accordance with the principles of the present invention.
Figure 4:
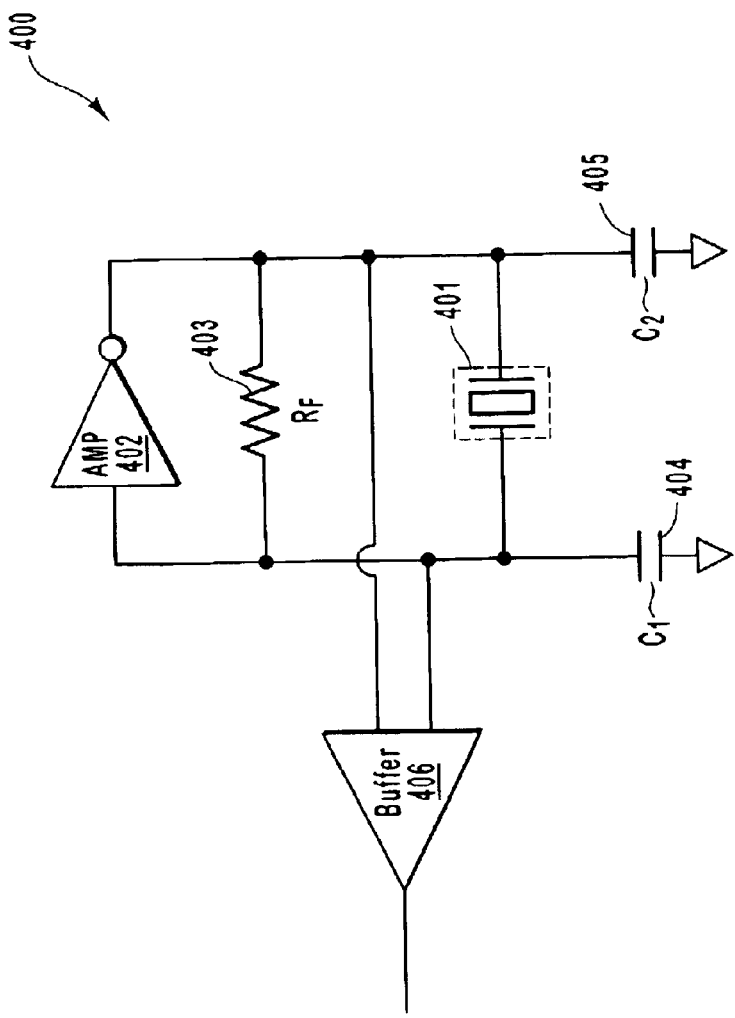
FIG. 4 illustrates a schematic diagram of an oscillator circuit in accordance with the prior art.

FIG. 1 illustrates an oscillation circuit 100 in accordance with the principles of the present invention. A portion of the oscillation circuit encompassed by the dotted box 1110 has the same configuration as shown for the convention oscillation circuit 400 shown in FIG. 4. More specifically, the oscillation circuit 100 includes a resonating element 101 such as a crystal, ceramic resonator, or inductor-capacitor equivalent circuit that tunes the oscillation circuit 100. One terminal of the resonating element 101 is provided as input to an inverting amplifier 102, which outputs the amplified signal to the other terminal of the resonating element 101. In this description and in the claims, an "inverting amplifier" is defined as any amplifier capable of sufficient gain and phase shift to allow oscillation. Accordingly, the definition of inverting amplifier is broad enough to include a strictly inverting amplifier, but is not limited to such an amplifier. Capacitor 104 (also identified as element C1) has one terminal connected to one terminal of the resonating element 101 and the other terminal connected to a substantially fixed voltage source such as ground. Likewise, capacitor 105 (also identified as element C2) has one terminal connected to the other terminal of the resonating element 101 and the other terminal connected to ground. Once again, the capacitors thus configured allow the terminals of the resonating element 101 to support an Alternating Current (AC) signal. Resistor 103 is used to bias up the amplifier and complete the Direct Current (DC) feedback loop while providing some AC gain isolation. The resonating element 101, the amplifier 102, the resistive feedback via resistor 103, and the buffer 106 all contribute noise for amplification.

The steady state differential AC voltage that exists across the terminals of the resonating element 101 may be directly used for some applications. However in the illustrated circuit 100, each terminal of the resonating element 101 may be provided as an input to a buffer 106 (also referred to herein as a "clock signal generation circuit" which operates as a limiting amplifier to thereby generate a binary signal having a polarity at any 8 given time that depends on which input voltage is higher. Accordingly, the output of the buffer 106 may be used as a stable clock signal that has a frequency that is the same as the differential AC voltage applied between the terminals of the resonant element 101.

Unlike conventional oscillator circuits, the oscillator circuit 100 includes a unique startup circuit 120. The startup circuit 120 includes an Alternating Current (AC) current source, which is represented in FIG. 1 by the combination of the oscillator 122, the inverter 130 and potentially also the amplifier 125. The amplifier 125 is an optional element that is provided in case the output of the oscillator 122 has insufficient magnitude to be useful. The AC Current source has two output terminals labeled 128 and 129. The inverter 130 is provided in order to ensure that the differential signals applied on output terminals 128 and 129 have equal, but opposite magnitudes at any given point in time, thereby allowing an AC differential voltage to be applied across output terminals 128 and 129 that is proportional to the AC signal generated by the oscillator 122.

The AC current source becomes active when the oscillator 122 becomes active, which is when the signal Kick EN is applied to the oscillator 122. The symbol "Kick EN" is short for "Kick Enable" where "Kick" refers to the stimulation of the resonating element 101 using the start-up circuit 120. FIG. 2 illustrates an embodiment of an oscillator that may serve as the oscillator 122 in the form of a temperature compensated ring oscillator. The oscillator 122, and the AC current source in general, is configured to generate a differential AC current between terminals 128 and 129 that has a frequency that is within a tolerance of the resonant frequency of the resonating element 101 for a given set of operating conditions. The tighter the tolerance, the shorter the startup times enabled by the principles of the present invention.

FIG. 2 illustrates a temperature compensated ring oscillator 200 that may be used to generate the AC current in accordance with one embodiment of the present invention. The temperature compensation allows the temperature compensated ring oscillator to generate AC currents have frequencies that are less dependent on temperature. Since the oscillator 122, may operate under a wide swing of temperatures (particularly if the implemented within a portable device that may be carried outside), such temperature compensation may significantly reduce variations in generated frequencies. Accordingly, the temperature compensated ring oscillator 200 is particularly useful as oscillator since tighter tolerances, and shorter startup times are enabled.

Referring to FIG. 2, the temperature compensated ring oscillator 200 includes a current source 201 that is tempera-ture compensated to thereby generate a relatively stable current with temperature fluctuations. The current source 201 is also trimmable to account for process variations in response to a ring oscillator trim word 205 received from the calibration circuit 123. The current source 201 generates a bias current that is provided to each of several current controlled inverters 202 through 204 coupled in series. The frequency of signal outputted by the last inverter 204 is controlled by the magnitude of the bias current. Accordingly, the generated frequency is also relatively stable with temperature and process variations.

Returning back to FIG. 1, start-up circuit 120 also includes two buffers 126 and 127 each having an input terminal connected to a respective output terminal 128 and 129 of the AC current source. When activated, the buffer 126 either passes the signal applied at its input terminal 128 directly through to its output terminal, or generates on its output terminal a signal that is time-wise roughly proportional to the signal applied at its input terminal 128. Otherwise, if the buffer is not activated, its output terminal is permitted to float regardless of the signal applied at its input terminal 128. Similarly, when activated, the buffer 127 either passes the signal applied at its input terminal 129 directly through to its output terminal, or generates on its output terminal a signal that is time-wise roughly proportional to the signal applied at its input terminal 129. Otherwise, if the buffer is not activated, its output terminal is permitted to float regardless of the signal applied at its input terminal 129. In other words, when the oscillator 122 is generating the AC current, that AC current in its differential form is actively applied to the differential terminals of the resonating element 101.

The start-up circuit 120 may also include a control logic circuit 121 that, when activated by start signal "Start", activates the AC current source by generating the signal, and the two buffers 126 and 127 (e.g., by generating the signal "Kick En") for a period of time that ensures startup given the difference between the frequency of the differential AC current generated by the AC current source and the resonant frequency of the resonant element, and given the set of operating conditions. For example, the control logic circuit 121 measures the period of time by counting cycles of the differential AC current generated by the AC current source. This may be accomplished using a counter circuit 124 (or a "kicker terminal counter") that counts the cycles of the differential AC current and reports the count to the control logic 121. When the count reaches a number that would indicate that sufficient time has passed for start-up, the control logic disables the AC current source and the buffers 126 and 127. Accordingly, rapid startup is accomplished by stimulating the terminals of the resonating circuit 101 by a differential AC current for a predetermined time period while still amplifying the resulting signal.

In a preferred embodiment, the oscillator 122 and the buffers 126 and 127 are all activated and deactivated at the same time. However, the oscillator 122 may be turned on or off before or after the buffers 126 and 127 is turned on or off, so long as the generated differential AC current is applied to the terminals of the resonating element 101' for sufficient time to allow for startup under most anticipated operating conditions.

The start-up circuit 120 also includes a calibration circuit 123, which is configured to calibrate the temperature compensated ring oscillator based on a trimming value. The calibration circuit 123 is further configured to generate the ring oscillator trim word 205 and provide that trimming value to the ring oscillator 122 (e.g., one time during the first startup).

Referring to FIG. 3, the calibration circuit 300 includes a phase detector 301 that receives the crystal frequency and the kicker frequency and instructs a ring oscillator frequency adjust circuit to generate a trimming value that will cause the ring oscillator 122 to speed up or slow down as appropriate. The calibration circuit 300 includes calibration control logic 303 which resets the phase detector when calibration begins, and instructs the ring oscillator frequency adjust circuit 302 to stop once the calibration is done. Accordingly, the AC differential current generated by the AC current source also compensates for process variations.

In summary, the circuit and method described herein allows for rapid and predictable startup times for stimulating the terminals of a resonating element for sufficient time and with a frequency that is close to the resonant frequency of the resonating element.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes, which come within the meaning and range of equivalency of the claims, are to be embraced within their scope.

What is claimed and desired secured by United States Letters Patent is:

1. An oscillation circuit comprising the following:
   a resonating element comprising first and second terminals, the resonating element capable of tuning the circuit at a resonant frequency;
   an inverting amplifier comprising an input terminal and an output terminal, the input terminal of the inverting amplifier connected to the first terminal of the resonating element, and the output terminal of the inverting amplifier connected to the second terminal of the resonating element;
   a resistor comprising first and second terminals, the first terminal of the resistor connected to the first terminal of the resonating element, the second terminal of the resistor connected to the second terminal of the resonating element;
   a first capacitor having a first terminal and a second terminal, the first terminal of the first capacitor connected to a substantially fixed voltage source, the second terminal of the first capacitor connected to the first terminal of the resonating element;
   a second capacitor having a first terminal and a second terminal, the first terminal of the second capacitor connected to a substantially fixed voltage source, the second terminal of the second capacitor connected to the second terminal of the resonating element;
   an Alternating Current (AC) current source having a first and a second output terminal, the AC current source, when active, configured to generate a differential AC current between the first and second output terminal of the AC current source: the differential AC current having a frequency that is within a tolerance of the resonant frequency of the resonant element for a given set of operating conditions;
   a first buffer configured to connect the first output terminal of the AC current source to the first terminal of the resonating element when active, and configured to disconnect the first output terminal of the AC current source to the first terminal of the resonating element when not active;
   a second buffer configured to connect the second output terminal of the AC current source to the second termi-nal of the resonating element when active, and configured to disconnect the second output terminal of the AC current source to the second terminal: of the resonating element when not active; and
   a control logic circuit, when activated, configured to activate the AC current source, the first buffer and the second buffer for a period of time that ensures startup given the difference between the frequency of the differential AC current generated by the AC current source and the resonant frequency of the resonant element, and given the set of operating conditions.

2. An oscillation circuit in accordance with claim 1, wherein the resonating element is a crystal.

3. An oscillation circuit in accordance with claim 1, wherein the AC current source includes a temperature compensated ring oscillator.

4. An oscillation circuit in accordance with claim 3, further comprising the following:
   a calibration circuit configured to calibrate the temperature compensated ring oscillator based on a trimming value.

5. An oscillation circuit in accordance with claim 4, wherein the calibration circuit is further configured to generate the trimming value.

6. An oscillation circuit in accordance with claim 5, wherein the calibration circuit is configured to generate the trimming value during the first startup of the oscillation circuit.

7. An oscillation circuit in accordance with claim 1, further comprising the following:
   a calibration circuit configured to calibrate the temperature compensated ring oscillator based on a trimming value.

8. An oscillation circuit in accordance with claim 7, wherein the calibration circuit is further configured to generate the trimming value.

9. An oscillation circuit in accordance with claim 8, wherein the calibration circuit is configured to generate the trimming value during the first startup of the oscillation circuit.

10. An oscillation circuit in accordance with claim 1, wherein the control logic measures the period of time by counting cycles of the differential AC current generated by the AC current source.

11. An oscillation circuit in accordance with claim 10, further comprising a counter circuit that counts the number of cycles of the differential AC current.

12. An oscillation circuit in accordance with claim 1, further comprising:
   a clock signal generation circuit having a first and second input terminal and an output terminal, the first input terminal of the clock signal generation circuit connected to the first terminal of the resonating element, the second input terminal of the clock signal generation circuit connected to the second terminal of the resonating element, the clock signal generation circuit configured to generate a binary signal having one state when the differential AC voltage between the first and second terminals of the resonating element is below a certain level, and having the opposite state when the differential AC voltage is not below the certain level.

13. A method for starting up an oscillation circuit that includes a resonating element capable of tuning the oscillation circuit at a resonant frequency, an inverting amplifier receiving one terminal of the resonating element as input and having an output terminal connected to the other terminal of the resonating element, a resistor coupled between the terminals of the resonating element, a first capacitor capacitively coupling one terminal of the resonating element to a substantially fixed voltage source, a second capacitor capacitively coupling the other terminal of the resonating element, an AC current source configured to generate a differential AC current applied between the two output terminals and having a frequency that is within a tolerance of the resonant frequency of the resonant element for a given set of operating conditions, a first buffer configured to connect one output terminal of the AC current source to one terminal of the resonating element when active and configured to disconnect the output terminal of the AC current source to the terminal of the resonating element when not active, a second buffer configured to connect the other output terminal of the AC current source to the other terminal of the resonating element when active, and configured to disconnect the other output terminal of the AC current source from the other terminal of the resonating element when not active, the method comprising the following:

- an act of activating the AC current source to thereby begin generating the differential AC current having the frequency;
- an act of activating the first and second buffers to thereby connect the output terminals of the AC current source to the terminals of the resonating element;
- an act of deactivating the AC current source to thereby cease generating the differential current having the frequency; and
- an act of deactivating the first and second buffer to thereby connect the output terminals of the AC current source from the terminals of the resonating element,
- wherein the differential AC current generated by the AC current source stimulates the resonating element from the later of the acts of activating to the earlier of the acts of deactivating, the acts of activating and the acts of deactivating timed so that the resonating element will start up for the given set of operating conditions given the difference between the frequency of the differential AC current generated by the AC current source and the resonant frequency of the resonant element.

14. A method in accordance with claim 13, wherein the acts of activating occur substantially simultaneously.

15. A method in accordance with claim 14, wherein the acts of deactivating occur substantially simultaneously.

16. A method in accordance with claim 13, wherein the acts of deactivating occur substantially simultaneously.

17. The method in accordance with claim 13, wherein the resonating element is a crystal.

18. The method in accordance with claim 13, wherein the AC current source includes a temperature compensated ring oscillator.

19. The method in accordance with claim 18, wherein the oscillation circuit further comprising the following:

- a calibration circuit configured to calibrate the temperature compensated ring oscillator based on a trimming value.

20. The method in accordance with claim 13, further comprising the following:

- an act of measuring the time between the later of the acts of activating and the earlier of the acts of deactivating.

21. The method in accordance with claim 20, wherein the act of measuring comprises the following:

- an act of counting a number of cycles of the generated differential AC current voltage between the later of the acts of activating and the earlier of the acts of deactivating.

* * * * *

UNITED STATES PATENT AND TRADEMARK OFFICE
CERTIFICATE OF CORRECTION

PATENT NO. : 6,819,195 B1
DATED : November 16, 2004
INVENTOR(S) : Blanchard et al.

It is certified that error appears in the above-identified patent and that said Letters Patent is hereby corrected as shown below:

Column 1,
Line 27, after "power mode" change "ito" to -- to --
Line 49, after "communication-oriented" insert -- , --
Line 57, before "amplifier 402," remove "aO"

Column 2,
Line 48, after "improvement in" insert -- the --

Column 4,
Line 27, before "the resonating element" change "coupled" to -- couple --
Line 49, after "the dotted box" change "110" to -- 110 --
Line 50, after "as shown for the" change "convention" to -- conventional --

Column 5,
Line 17, after "polarity at any" remove "8"
Line 56, after "AC currents" change "have" to -- having --
Line 58, after "oscillator 122" remove ","
Line 63, after "useful as" insert -- an --
Line 64, after "tolerances." remove ","

Column 6,
Line 8, change "signal outputted" to -- the signal that is output --
Line 56, after "126 and 127" change "is" to -- are --
Line 58, after "resonating element" change "101" to -- 101 --

Signed and Sealed this

Twenty-fourth Day of May, 2005

JON W. DUDAS
*Director of the United States Patent and Trademark Office*